US012628568B2

(12) United States Patent
Wang et al.

(10) Patent No.: US 12,628,568 B2
(45) Date of Patent: May 12, 2026

(54) MAGNETORESISTIVE RANDOM ACCESS MEMORY AND METHOD FOR FABRICATING THE SAME

(71) Applicant: UNITED MICROELECTRONICS CORP., Hsin-Chu City (TW)

(72) Inventors: Hui-Lin Wang, Taipei City (TW); Ching-Hua Hsu, Kaohsiung City (TW); Che-Wei Chang, Taichung City (TW); Chen-Yi Weng, New Taipei City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 486 days.

(21) Appl. No.: 18/142,036

(22) Filed: May 2, 2023

(65) Prior Publication Data

US 2024/0334836 A1     Oct. 3, 2024

(30) Foreign Application Priority Data

Mar. 30, 2023    (TW) ................................. 112112218

(51) Int. Cl.
*H10N 50/01* (2023.01)
*G11C 11/16* (2006.01)
*H10B 61/00* (2023.01)
*H10N 50/10* (2023.01)
*H10N 50/80* (2023.01)

(52) U.S. Cl.
CPC ........... *H10N 50/01* (2023.02); *G11C 11/161* (2013.01); *H10B 61/00* (2023.02); *H10N 50/10* (2023.02); *H10N 50/80* (2023.02)

(58) Field of Classification Search
CPC ........ H10N 50/01; H10N 50/80; H10N 50/10; G11C 11/161; H10B 61/00
USPC ......................................................... 257/421
See application file for complete search history.

(56) References Cited

U.S. PATENT DOCUMENTS

| | | | |
|---|---|---|---|
| 9,159,910 B2 | 10/2015 | Kang et al. | |
| 10,784,440 B2 * | 9/2020 | Tseng ........................ | A61K 8/55 |
| 2016/0118577 A1 * | 4/2016 | Chen ....................... | H10N 50/10 |
| | | | 257/421 |
| 2017/0092692 A1 * | 3/2017 | Kalnitsky .............. | H10N 50/10 |
| 2017/0301728 A1 * | 10/2017 | Chuang ................... | H10N 50/80 |
| 2021/0336130 A1 * | 10/2021 | Chien ..................... | H10N 50/01 |
| 2022/0384710 A1 * | 12/2022 | Yi ........................... | H10N 50/80 |
| 2023/0019156 A1 * | 1/2023 | Kim ........................ | H10N 50/10 |
| 2023/0380291 A1 * | 11/2023 | Chien .................... | H10N 50/85 |

OTHER PUBLICATIONS

Wang, the specification, including the claims, and drawings in the U.S. Appl. No. 16/589,157, filed Oct. 1, 2019.

* cited by examiner

*Primary Examiner* — Jami Valentine Miller
(74) *Attorney, Agent, or Firm* — Winston Hsu

(57) ABSTRACT

A method for fabricating a semiconductor device includes the steps of providing a substrate comprising a magnetic random access memory (MRAM) region and a logic region, forming a first magnetic tunneling junction (MTJ) on the MRAM region, forming a first inter-metal dielectric (IMD) layer around the first MTJ, and then forming a first metal interconnection extending from the MRAM region to the logic region on the first MTJ. Preferably, the first metal interconnection on the MRAM region and the first metal interconnection on the logic region have different heights.

16 Claims, 6 Drawing Sheets

MAGNETORESISTIVE RANDOM ACCESS MEMORY AND METHOD FOR FABRICATING THE SAME

BACKGROUND OF THE INVENTION

1. Field of the Invention

The invention relates to a method for fabricating semiconductor device, and more particularly to a method for fabricating a magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes the steps of providing a substrate comprising a magnetic random access memory (MRAM) region and a logic region, forming a first magnetic tunneling junction (MTJ) on the MRAM region, forming a first inter-metal dielectric (IMD) layer around the first MTJ, and then forming a first metal interconnection extending from the MRAM region to the logic region on the first MTJ. Preferably, the first metal interconnection on the MRAM region and the first metal interconnection on the logic region have different heights.

According to another aspect of the present invention, a semiconductor device includes a substrate including a magnetic random access memory (MRAM) region and a logic region, a first magnetic tunneling junction (MTJ) on the MRAM region, a first inter-metal dielectric (IMD) layer around the first MTJ, and a first metal interconnection extending from the MRAM region to the logic region on the first MTJ. Preferably, the first metal interconnection on the MRAM region and the first metal interconnection on the logic region have different heights.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
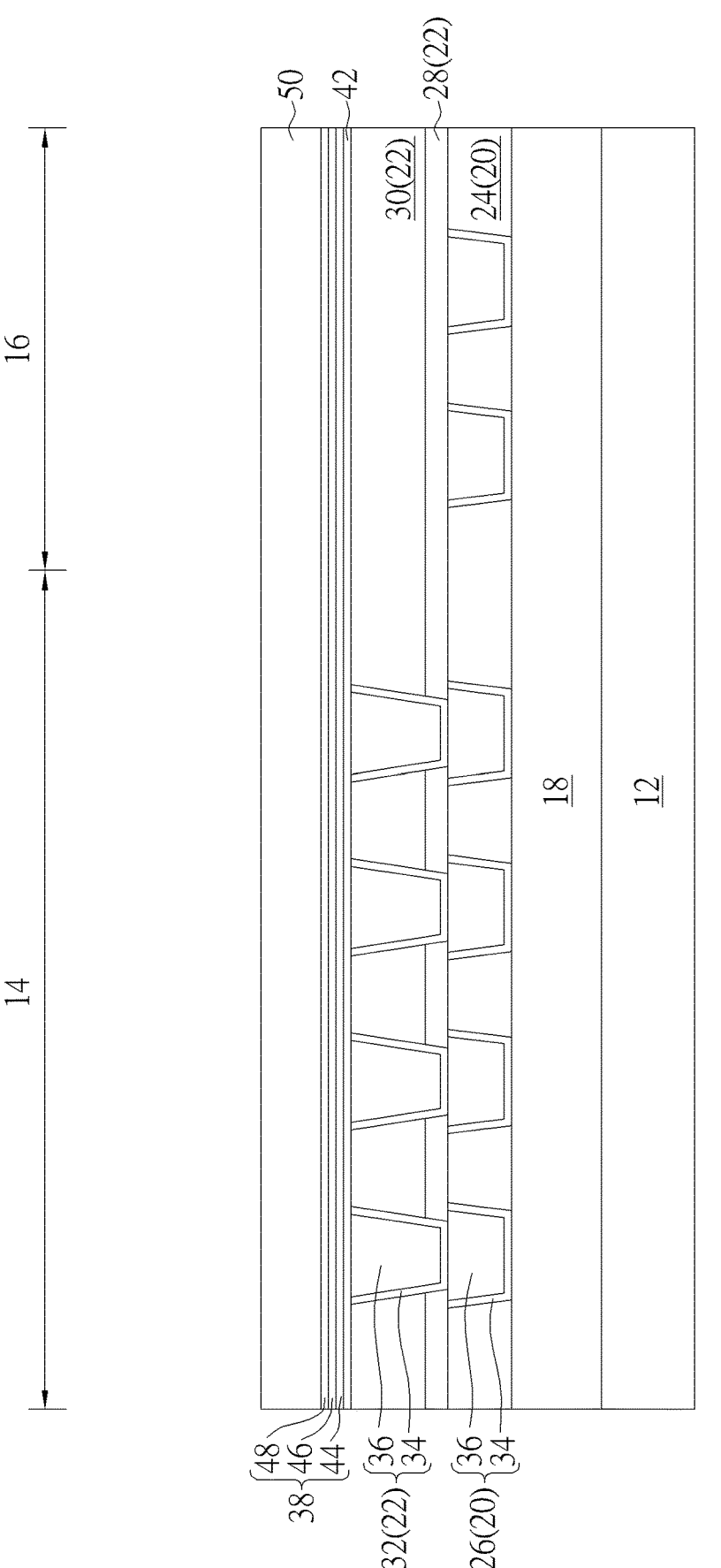
FIGS. 1-5 illustrate a method for fabricating a MRAM device according to an embodiment of the present invention.

Referring to FIGS. 1-5, FIGS. 1-5 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a bottom electrode 42, a MTJ stack 38 or stack structure, a top electrode 50, and a patterned mask (not shown) are formed on the metal interconnect structure 22. In this embodiment, the formation of the MTJ stack 38 could be accomplished by sequentially depositing a pinned layer 44, a barrier layer 46, and a free layer 48 on the bottom electrode 42. In this embodiment, the bottom electrode layer 42 and the top electrode layer 50 are preferably made of conductive material including but not limited to for example Ta, Pt, Cu, Au, Al, or combination thereof. The pinned layer 44 could be made of ferromagnetic material including but not limited to for example iron, cobalt, nickel, or alloys thereof such as cobalt-iron-boron (CoFeB) or cobalt-iron (CoFe). Moreover, the pinned layer 44 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The barrier layer 46 could be made of insulating material including but not limited to for example oxides such as aluminum oxide ($AlO_x$) or magnesium oxide (MgO). The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field.

Figure 2:
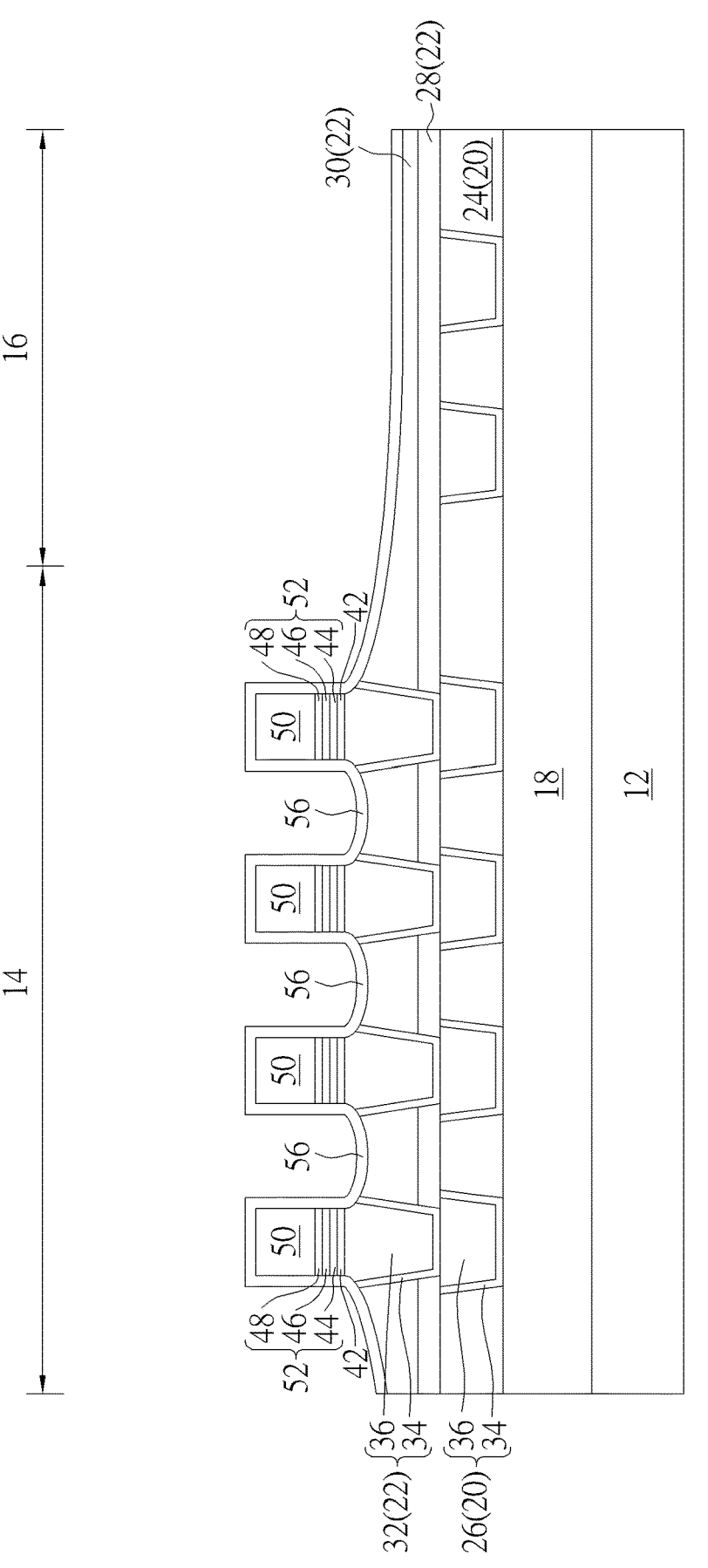

Next, as shown in FIG. 2, one or more etching process is conducted by using the patterned mask as mask to remove part of the top electrode 50, part of the MTJ stack 38, part of the bottom electrode 42, and part of the IMD layer 30 to form MTJs 52 on the MRAM region 14. It should be noted that a reactive ion etching (RIE) and/or an ion beam etching (IBE) process is conducted to remove the top electrode 50, MTJ stack 38, bottom electrode 42, and the IMD layer 38 in this embodiment for forming the MTJ 52. Due to the characteristics of the IBE process, the top surface of the remaining IMD layer 30 is slightly lower than the top surface of the metal interconnections 32 after the IBE process and the top surface of the IMD layer 30 also reveals a curve or an arc. It should also be noted that as the IBE process is conducted to remove part of the IMD layer 30, part of the metal interconnection 32 is removed at the same time to form inclined sidewalls on the surface of the metal interconnection 32 immediately adjacent to the MTJs 52. Next, a cap layer 56 is formed on the MTJs 52 while covering the surface of the IMD layer 30. In this embodiment, the cap layer 56 preferably includes silicon nitride, but could also include other dielectric material including but not limited to for example silicon oxide, silicon oxynitride (SiON), or silicon carbon nitride (SiCN).

Figure 3:
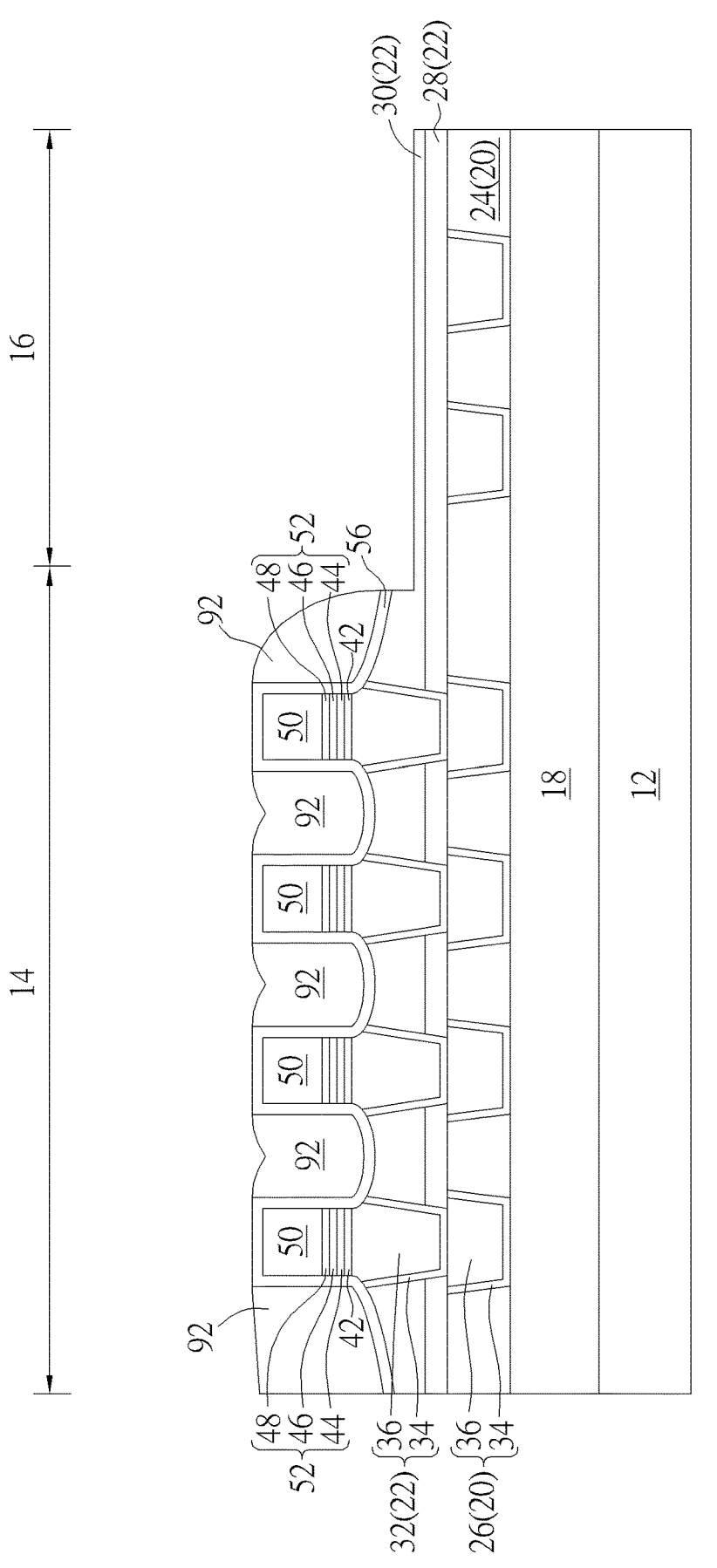

Next, as shown in FIG. 3, an atomic layer deposition (ALD) process is conducted to form a dielectric layer 92 on the MTJs 52, and an etching back process is conducted to remove part of the dielectric layer 92, part of the cap layer 56, and part of the IMD layer 30 on the MRAM region 14 and logic region 16 so that the remaining dielectric layer 92 is only disposed around the MTJs 52 on the MRAM region 14, in which a top surface of the IMD layer 92 between adjacent MTJs 52 includes a V-shape profile. It should be noted that even though the IMD layer 30 on the MRAM region 14 and logic region 16 in particular are remained without exposing the stop layer 28 underneath during the removal of the IMD layer 92, according to other embodiment of the present invention, it would also be desirable to remove all of the IMD layer 30 on the logic region 16 to expose the stop layer 28 underneath after the IMD layer 92 is removed, which is also within the scope of the present invention.

Figure 4:
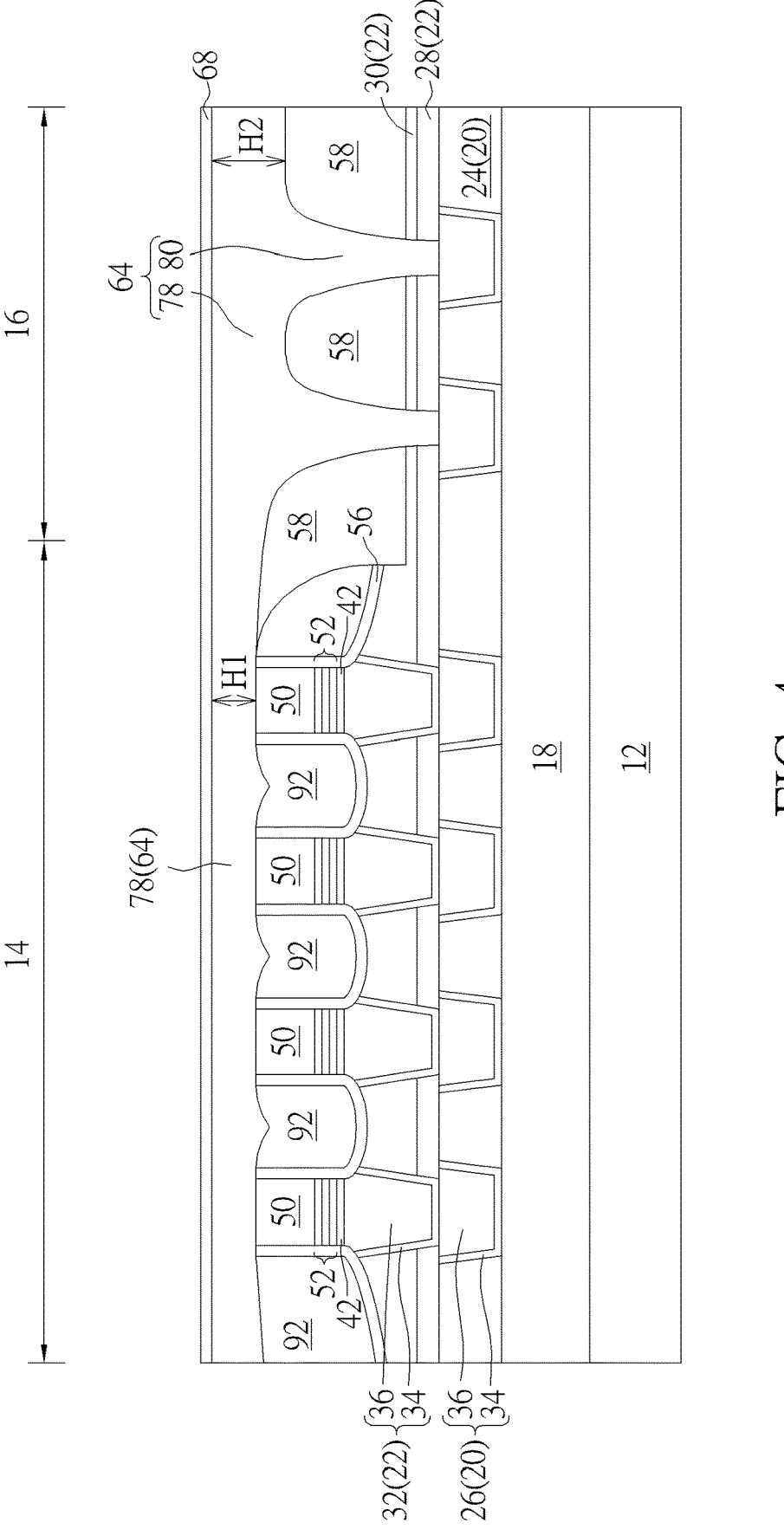

Next, as shown in FIG. 4, an IMD layer 58 is formed on the MRAM region 14 and logic region 16 to cover the dielectric layer 92, and a planarizing process such as CMP is conducted to remove part of the IMD layer 58 so that the remaining IMD layer 58 includes a planar top surface. In this embodiment, the dielectric layer 92 preferably includes silicon oxide while the IMD layer 58 preferably include an ultra low-k (ULK) dielectric layer including but not limited to for example porous material or silicon oxycarbide (SiOC) or carbon doped silicon oxide (SiOCH).

Next, one or more pattern transfer process is conducted by using a patterned mask (not shown) to remove part of the IMD layer 58, part of the dielectric layer 92, and part of the cap layer 56 on the MRAM region 14 and logic region 16 to form contact holes (not shown) exposing the top electrodes 50 on the MRAM region 14 and the metal interconnections 26 on the logic region 16, and conductive materials are deposited into the contact holes afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the conductive materials including the aforementioned barrier layer and metal layer to form contact plugs or a metal interconnection 64 in the contact holes electrically connecting the MTJs 52 and the metal interconnections 26. Next, a stop layer 68 is formed on the IMD layer 58 and the metal interconnection 64, in which the stop layer 68 could include silicon oxide, silicon nitride, or SiCN.

It should be noted that the metal interconnection 64 formed at this stage preferably extends from the MRAM region 14 to the logic region 16, in which the metal interconnection 64 on the MRAM region 14 includes a trench conductor 78 while the metal interconnection on the logic region 16 includes both trench conductor 78 and via conductors 80 connected to the metal interconnections 26 on the lower level. Preferably, the metal interconnection 64 on the MRAM region 14 and the metal interconnection 64 on the logic region 16 have different heights. Specifically, the top surface of the metal interconnection 64 on the MRAM region 14 is even with the top surface of the metal interconnection 64 on the logic region 16 while the height of the metal interconnection 64 on the MRAM region 14 is less than the height of the metal interconnection 64 on the logic region 16. Preferably, the height of the metal interconnection 64 on each region refers to the maximum height H1 of the metal interconnection 64 on the MRAM region 14 and the maximum height H2 of the trench conductor 78 on the logic region 16, in which H1<H2.

Figure 5:
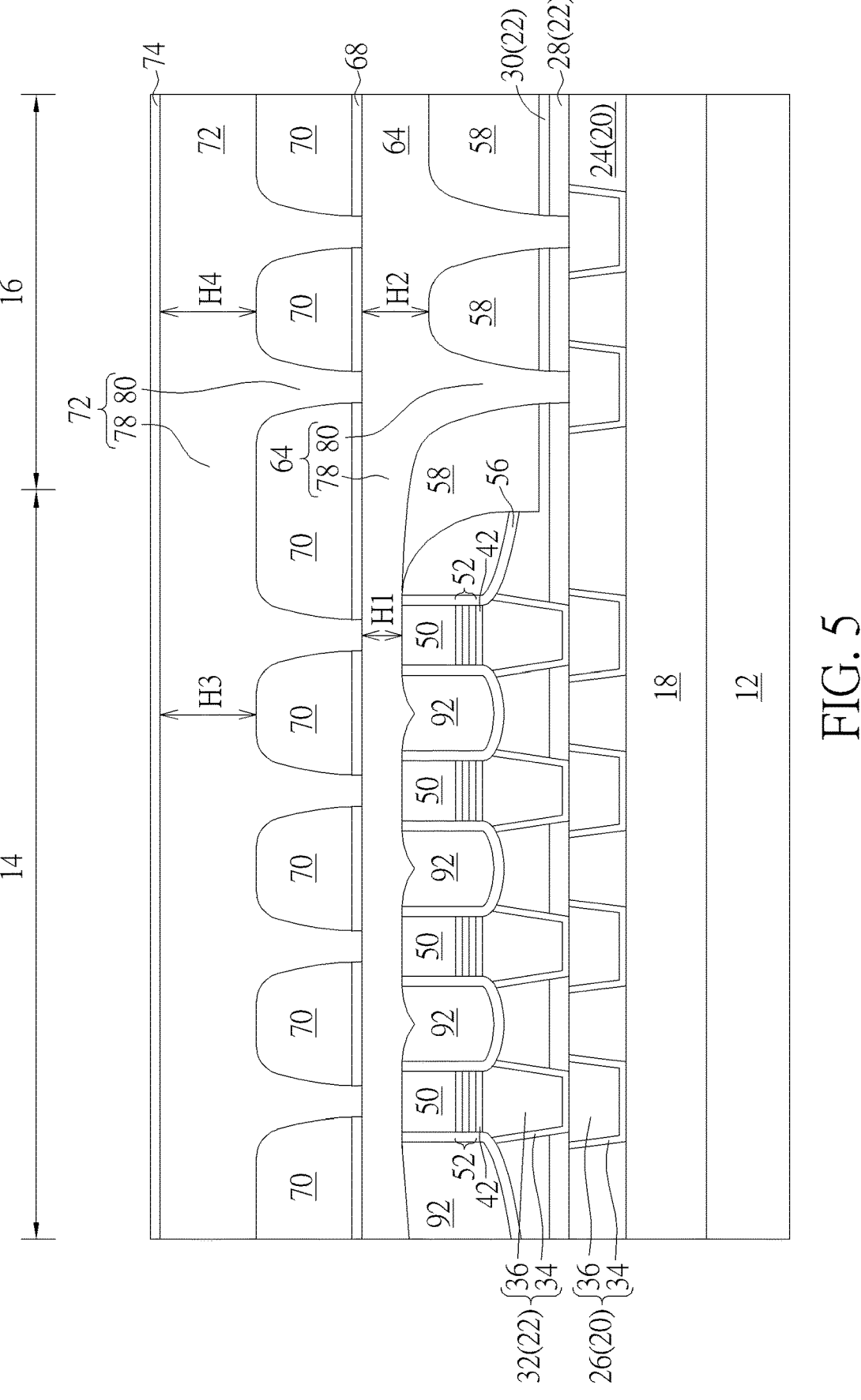

Next, as shown in FIG. 5, an IMD layer 70 is formed on the stop layer 68, and one or more photo-etching process is conducted to remove part of the IMD layer 70 and part of the stop layer 68 on the MRAM region 14 and logic region 16 to form contact holes (not shown). Next, conductive materials are deposited into each of the contact holes and a planarizing process such as CMP is conducted to form metal interconnections 72 connecting the MTJs 52 and metal interconnections 64 underneath. Next, another stop layer 74 is formed on the IMD layer 70 to cover the metal interconnections 72.

It should be noted that the metal interconnection 72 formed at this stage also extends from the MRAM region 14 to the logic region 16, in which the metal interconnection 72 on both MRAM region 14 and logic region 16 includes a trench conductor 78 and via conductors 80 connected to the lower level metal interconnection 64. In contrast to the lower level metal interconnection 64 extending from the MRAM region 14 to the logic region 16 have different heights, the metal interconnection 72 also extending from the MRAM region 14 to the logic region 16 have same height. Specifically, the top surface of the metal interconnection 72 on the MRAM region 14 is even with the top surface of the metal interconnection 72 on the logic region 16 while the height of the metal interconnection 72 on the MRAM region 14 is equal to the height of the metal interconnection 72 on the logic region 16. Preferably, the height of the metal interconnection 72 on each region refers to the maximum height H3 of the trench conductor 78 of the metal interconnection 72 on the MRAM region 14 and the maximum height H4 of the trench conductor 78 of the metal interconnection 72 on the logic region 16, in which H3=H4.

In this embodiment, the stop layers 68 and 74 could be made of same or different materials, in which the two layers 68, 74 could all include nitrogen doped carbide (NDC), silicon nitride, silicon carbon nitride (SiCN), or combination thereof. Similar to the metal interconnections formed previously, each of the metal interconnections 72 could be formed in the IMD layer 70 through a single damascene or dual damascene process. For instance, each of the metal interconnections 72 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Figure 6:
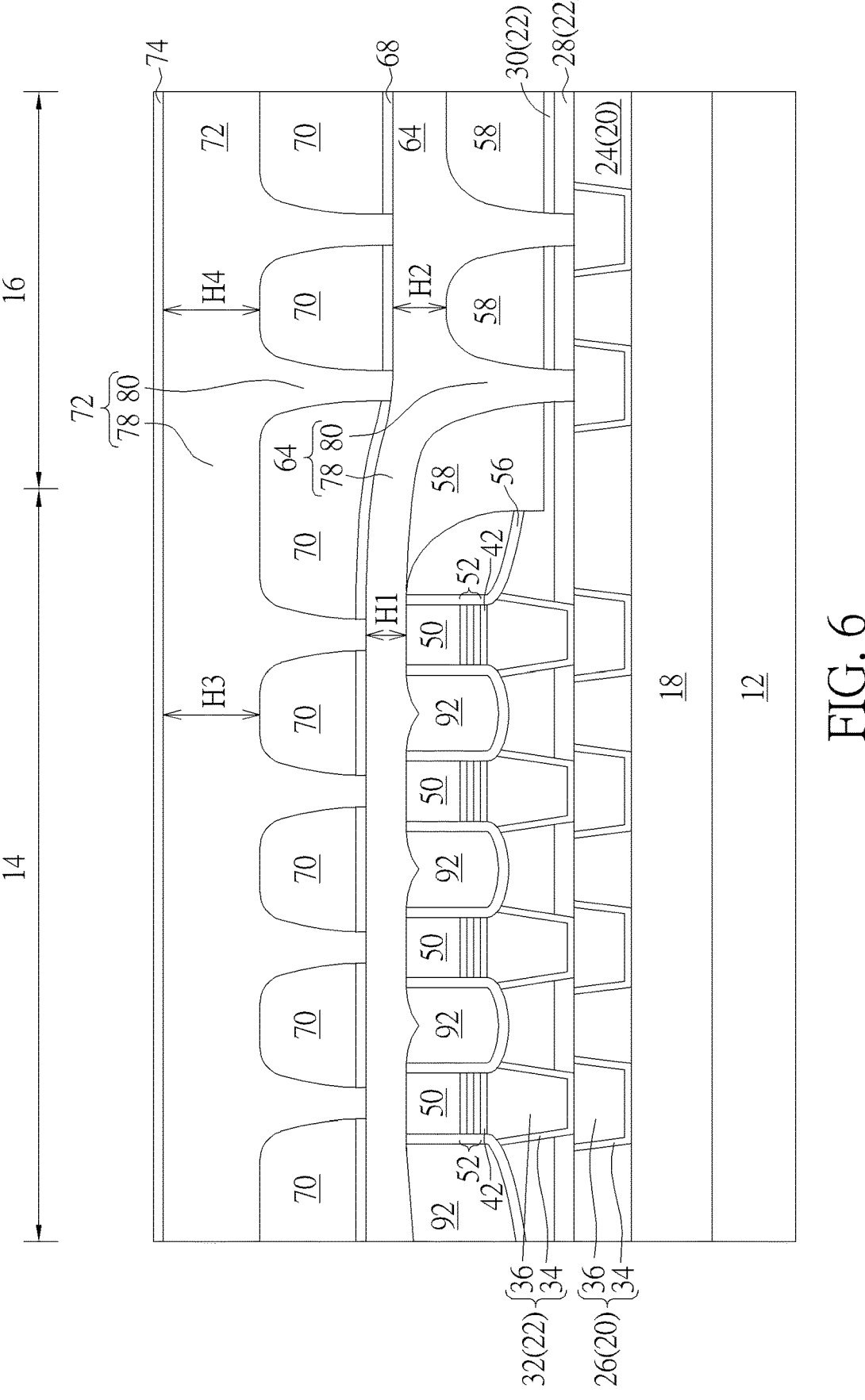
FIG. 6 illustrates a structural view of a semiconductor device according to an embodiment of the present invention.

Referring to FIG. 6, FIG. 6 illustrates a structural view of a semiconductor device according to an embodiment of the present invention. As shown in FIG. 6, in contrast to the top surface of the metal interconnection 64 on the MRAM region 14 being even with the top surface of the metal interconnection 64 on the logic region 16 as shown in FIG. 5, the top surface of the metal interconnection 64 on the logic region 16 in this embodiment is slightly lower than the top surface of the metal interconnection 64 on the MRAM region 14 while the height of the metal interconnection 64 on the MRAM region 14 is less than the height of the metal interconnection 64 on the logic region 16. As disclosed in the aforementioned embodiment, the height of the metal interconnection preferably refers to the maximum height H1 of the metal interconnection 64 on the MRAM region 64 and the maximum height H2 of the trench conductor 78 on the logic region 16, in which H1<H2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate comprising a magnetic random access memory (MRAM) region and a logic region;
   forming a first magnetic tunneling junction (MTJ) on the MRAM region;
   forming a first inter-metal dielectric (IMD) layer around the first MTJ; and
   forming a first metal interconnection extending continuously from the MRAM region to the logic region on the first MTJ, wherein the first metal interconnection on the MRAM region and the first metal interconnection on the logic region comprise same element and different heights.

2. The method of claim 1, further comprising:
   forming the first MTJ and a second MTJ on the MRAM region;
   forming a cap layer on the first MTJ and the second MTJ;
   forming a dielectric layer on the cap layer;
   patterning the dielectric layer and the cap layer; and
   forming the first IMD layer on the dielectric layer;
   forming the first metal interconnection on the first MTJ and the second MTJ and the first metal interconnection on the logic region;
   forming a stop layer on the first metal interconnection;
   forming a second IMD layer on the stop layer; and
   forming a second metal interconnection extending from the MRAM region to the logic region in the second IMD layer and connected to the first metal interconnection on the MRAM region and the first metal interconnection on the logic region.

3. The method of claim 2, wherein the second metal interconnection on the MRAM region and the second metal interconnection on the logic region comprise same height.

4. The method of claim 2, wherein the dielectric layer is between the first MTJ and the second MTJ.

5. The method of claim 4, wherein a top surface of the dielectric layer comprises a V-shape.

6. The method of claim 1, wherein top surfaces of the first metal interconnection on the MRAM region and the first metal interconnection on the logic region are coplanar.

7. The method of claim 1, wherein a top surface of the first metal interconnection on the logic region is lower than a top surface of the first metal interconnection on the MRAM region.

8. The method of claim 1, wherein a height of the first metal interconnection on the MRAM region is less than a height of the first metal interconnection on the logic region.

9. A semiconductor device, comprising:
   a substrate comprising a magnetic random access memory (MRAM) region and a logic region;
   a first magnetic tunneling junction (MTJ) on the MRAM region;
   a first inter-metal dielectric (IMD) layer around the first MTJ; and
   a first metal interconnection extending continuously from the MRAM region to the logic region on the first MTJ, wherein the first metal interconnection on the MRAM region and the first metal interconnection on the logic region comprise same element and different heights.

10. The semiconductor device of claim 9, further comprising:

a second MTJ on the MRAM region;

a cap layer adjacent to the first MTJ and the second MTJ;

a dielectric layer around the cap layer;

the first IMD layer around the dielectric layer;

the first metal interconnection on the first MTJ and the second MTJ;

a stop layer on the first metal interconnection;

a second IMD layer on the stop layer; and a second metal interconnection extending from the MRAM region to the logic region in the second IMD layer and connected to the first metal interconnection on the MRAM region and the first metal interconnection on the logic region.

11. The semiconductor device of claim 10, wherein the second metal interconnection on the MRAM region and the second metal interconnection on the logic region comprise same height.

12. The semiconductor device of claim 10, wherein the dielectric layer is between the first MTJ and the second MTJ.

13. The semiconductor device of claim 12, wherein a top surface of the dielectric layer comprises a V-shape.

14. The semiconductor device of claim 9, wherein top surfaces of the first metal interconnection on the MRAM region and the first metal interconnection on the logic region are coplanar.

15. The semiconductor device of claim 9, wherein a top surface of the first metal interconnection on the logic region is lower than a top surface of the first metal interconnection on the MRAM region.

16. The semiconductor device of claim 9, wherein a height of the first metal interconnection on the MRAM region is less than a height of the first metal interconnection on the logic region.

* * * * *